(12) United States Patent
Balasingam et al.

(10) Patent No.: US 9,735,711 B2
(45) Date of Patent: Aug. 15, 2017

(54) FLEXURE-ENHANCING SYSTEM FOR IMPROVED POWER GENERATION IN A WIND-POWERED PIEZOELECTRIC SYSTEM

(71) Applicants: Arjun Balasingam, San Jose, CA (US); James M. Janky, Los Altos, CA (US)

(72) Inventors: Arjun Balasingam, San Jose, CA (US); James M. Janky, Los Altos, CA (US)

(*) Notice: Subject to any disclaimer, the term of this patent is extended or adjusted under 35 U.S.C. 154(b) by 446 days.

(21) Appl. No.: 14/320,396

(22) Filed: Jun. 30, 2014

(65) Prior Publication Data

US 2014/0312742 A1 Oct. 23, 2014

Related U.S. Application Data

(63) Continuation-in-part of application No. 13/842,203, filed on Mar. 15, 2013.

(51) Int. Cl.
*H02N 2/18* (2006.01)
*H01L 41/113* (2006.01)
*H02N 2/00* (2006.01)
*H02S 10/00* (2014.01)

(52) U.S. Cl.
CPC ............. *H02N 2/22* (2013.01); *H01L 41/113* (2013.01); *H02N 2/185* (2013.01); *H02S 10/00* (2013.01); *Y10T 29/42* (2015.01)

(58) Field of Classification Search
CPC ............... H01L 41/113; H01L 41/1134; H01L 41/1136; H01L 41/1138
USPC ........................................................ 310/339
See application file for complete search history.

(56) References Cited

U.S. PATENT DOCUMENTS

| 5,223,763 | A | 6/1993 | Chang |
| 8,102,072 | B2 | 1/2012 | Tsou |
| 8,541,927 | B2 | 9/2013 | Hayamizu |
| 2008/0150286 | A1* | 6/2008 | Fein ...................... B60K 16/00 290/44 |
| 2010/0164231 | A1 | 7/2010 | Tsou |
| 2011/0018396 | A1 | 1/2011 | Hayamizu |
| 2014/0265733 | A1 | 9/2014 | Balasingam |

* cited by examiner

*Primary Examiner* — Derek Rosenau

(57) ABSTRACT

Improving wind-based piezoelectric power conversion is provided. For example, a piezoelectric element affixed to a vibratory member is provided. A rigid mounting system coupled with a rotatable base is provided for said vibratory member on one end of the vibratory member. A solar generator is coupled with the rigid mounting system and at least one obstacle is provided located on the flexing side of the vibratory member. The obstacle induces a vortex in the wind passing the obstacle and arriving at the vibratory member, which enhances wind-induced displacement in the vibratory member.

26 Claims, 9 Drawing Sheets

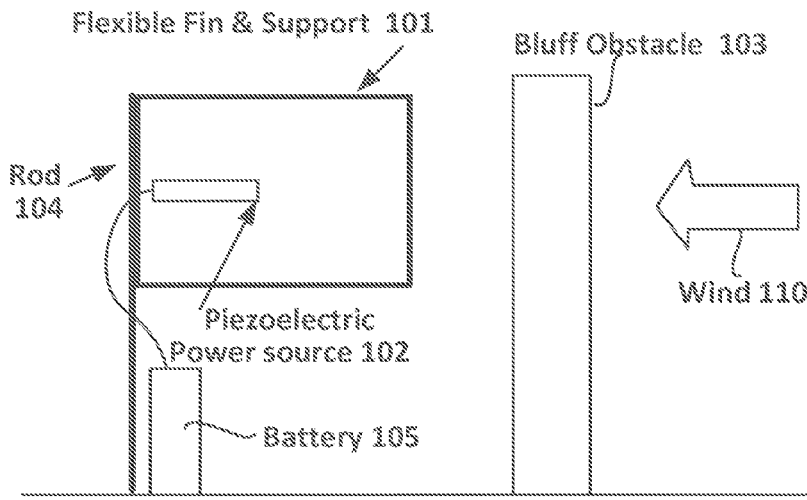
FIG. 1 Piezoelectric Generator on Vibratory Member with Vortex-Inducing Bluff
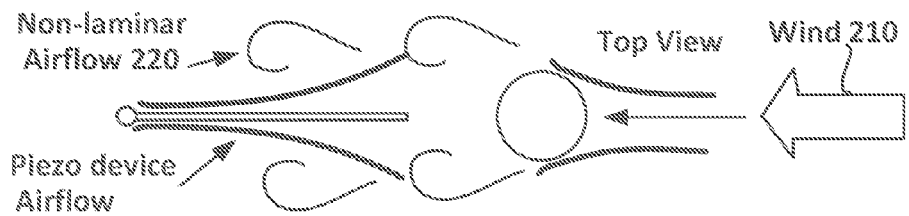
FIG. 2 Vortex action induces greater displacement
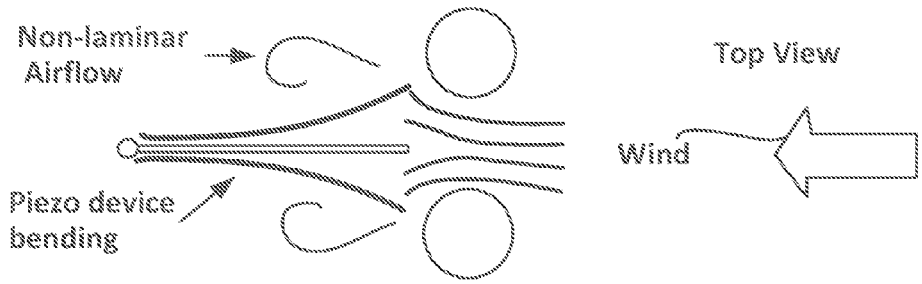
FIG. 3 Dual Bluff System

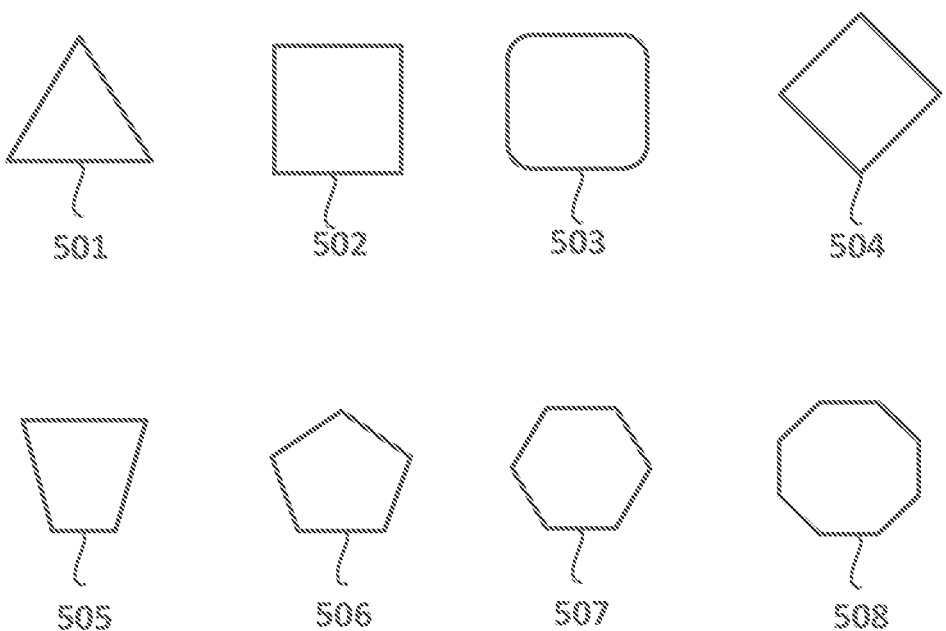
FIG. 5 Alternate Bluff Obstacle Cross-sections

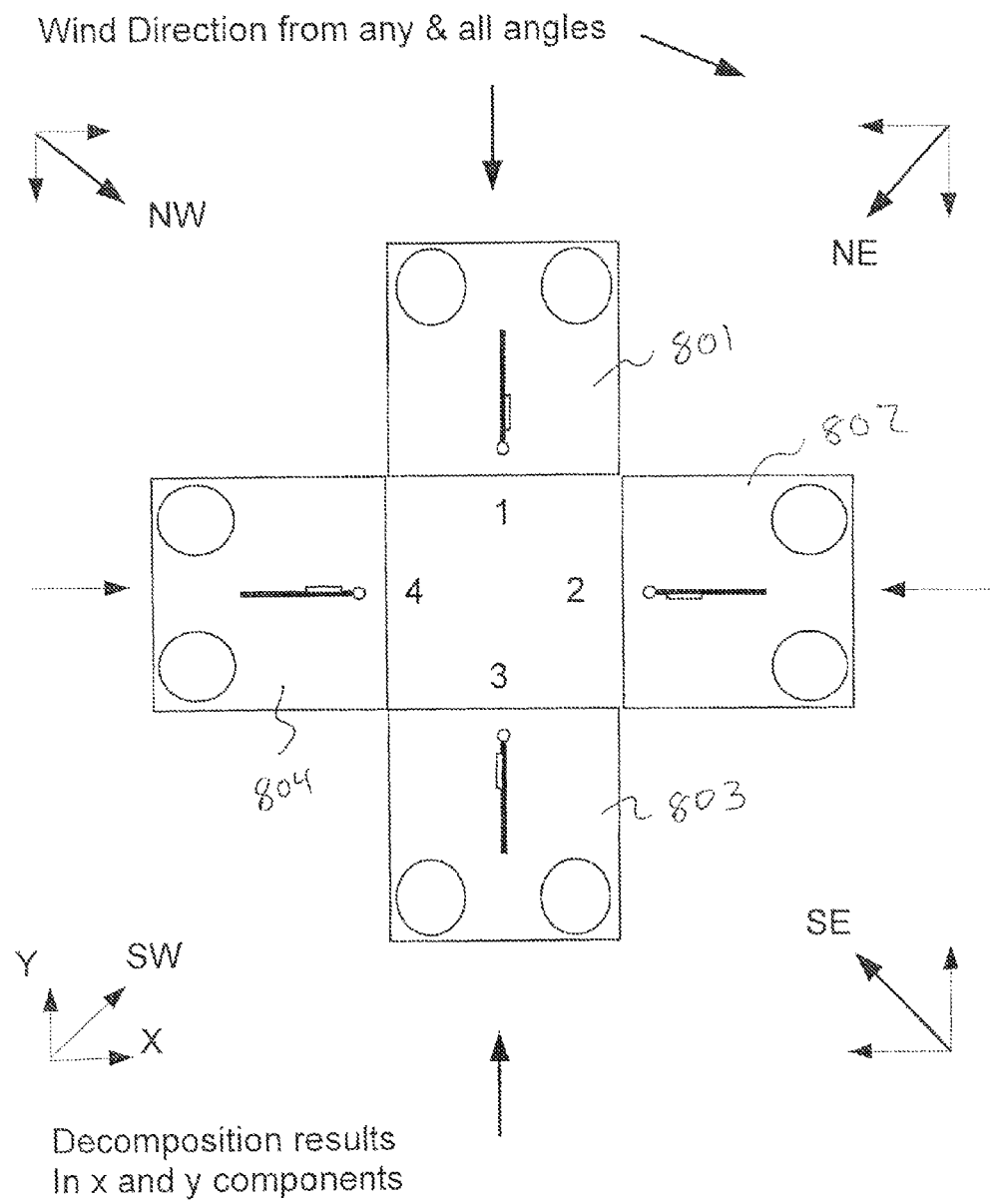
Fig. 8A Four Unit Configuration for capturing wind power from any direction

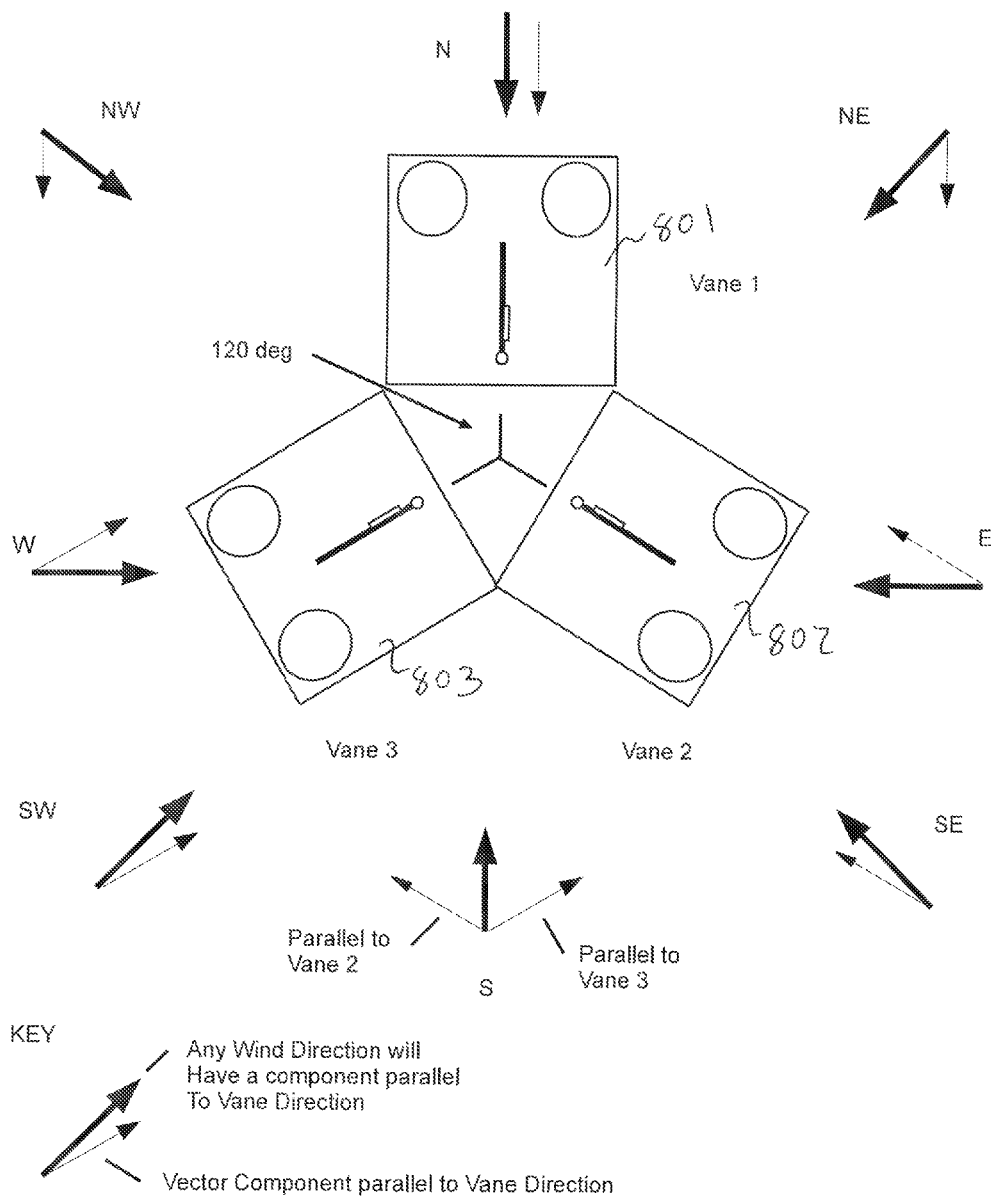
Fig. 8B Three Unit Configuration for capturing wind power from any direction 120 degree orientation for each unit

FLEXURE-ENHANCING SYSTEM FOR IMPROVED POWER GENERATION IN A WIND-POWERED PIEZOELECTRIC SYSTEM

CROSS-REFERENCE TO RELATED U.S. APPLICATION

This application claims priority to and is a continuation-in-part of the co-pending patent application Ser. No. 13/842,203, entitled "FLEXURE-ENHANCING SYSTEM FOR IMPROVED POWER GENERATION IN A WIND-POWERED PIEZOELECTRIC SYSTEM," with filing date of Mar. 15, 2013, assigned to the assignee of the present application and hereby incorporated by reference in its entirety.

FIELD OF THE INVENTION

The present invention relates to a piezoelectric power generation device with an enhanced power output as compared to more conventional devices.

BACKGROUND

Wind-powered piezoelectric devices are known to produce small amounts of power, thus requiring many piezoelectric devices to recharge a battery in a given amount of time. There is a need to significantly enhance the power output by a given piezoelectric device.

BRIEF DESCRIPTION OF THE DRAWINGS

The accompanying drawings, which are incorporated in and form a part of this Description of Embodiments, illustrate various embodiments of the present invention and, together with the description, serve to explain principles discussed below:

FIG. 1 depicts a piezoelectric power source that is affixed to a flexible sheet, which is in turn attached to a support rod, according to one embodiment.

FIG. 2 depicts a top view of a device, showing vortex action with a single bluff obstacle, according to one embodiment.

FIG. 3 depicts a top view of a device, showing vortex action with 2 bluff obstacles, according to one embodiment.

FIG. 5 depicts a top view for bluff obstacle cross sections, according to one embodiment.

FIG. 8A shows four exemplary power generating devices coupled together, according to one embodiment.

FIG. 8B shows three exemplary power generating devices coupled together, according to one embodiment.

Figure 4A:
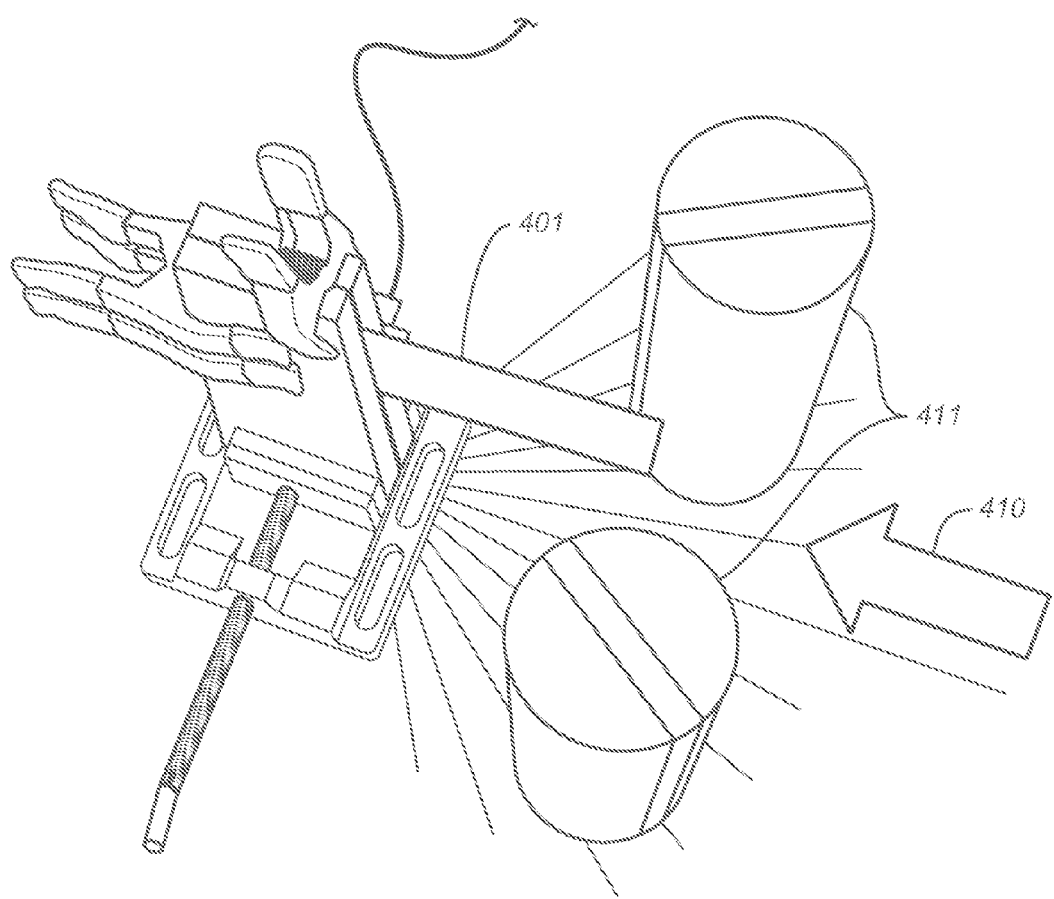
FIGS. 4A and 4B depict images of a working model of a twin bluff obstacle of the invention, according to one embodiment.

The drawings referred to in this Brief Description should not be understood as being drawn to scale unless specifically noted.

DESCRIPTION OF EMBODIMENTS

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in the following Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Wind-powered piezoelectric devices are known to produce small amounts of power, thus requiring many piezoelectric devices to recharge a battery in a given amount of time. The power output of a given piezoelectric device can be enhanced significantly by increasing the amount of flexure the piezoelectric device experiences for a given wind speed, according to various embodiments. There are many configurations for arranging to induce flexure in a piezoelectric power generator. Baseline power outputs are often measured in the microwatt region, with 8 microwatts being typical. However, ganging multiple piezoelectric devices on a single flexible mounting system increases power, but at a small rate.

According to various embodiments, A piezoelectric power generating device is affixed to a thin brass sheet, which in turn is mounted to a support rod at one end of the sheet. For example, when the plane of the brass sheet is aligned with the direction of incoming wind, the sheet can vibrate by itself, due to small differences in wind arrival direction. The amplitude of these vibrations can be enhanced dramatically by introducing a vortex-inducing obstacle in the path of the wind. The increased turbulence associated with the vortex causes much larger displacements of the thin brass sheet, thereby inducing greater flexure in the sheet and thus in the piezoelectric device, according to an embodiment. Therefore, according to various embodiments, this is a flexural enhancing system for a piezoelectric wind-powered source.

According to various embodiments, any suitable flexible material may be used for the vibratory fin. For example, a plastic sheet, a carbon-fiber sheet, or any other metallic sheet with sufficient flexural bending without cracking can be used. According to one embodiment, the thickness for a brass sheet is 0.032 in. For example, the size of the sheet may be 4 inches by 10 inches. However, various embodiments do not depend on a 4 inch by 10 inch size, and, therefore, the size can be adjusted to suit the user's needs.

The piezoelectric device can be mounted at the constrained end of the fin so that this first end of the piezoelectric device is not able to move, according to one embodiment. The other end can move when the fin is deflected in either direction about the axis of the supporting post by the wind, as shown in FIG. 2 and FIG. 3, according to one embodiment. For example, as shown in FIG. 2, the piezoelectric device can experience a bending moment as the fin is displaced in either direction from the rest position.

FIG. 1 depicts a piezoelectric power source 102 that is affixed to a flexible sheet 101, which is in turn attached to a support rod 104, according to one embodiment.

For example, the support rod may be mounted in an anchoring system, not shown. The electric current can be generated by the piezoelectric power source 102 that is conveyed to a battery 105 to charge the battery. In an embodiment, suitable power conditioning (not shown) may be inserted between the piezoelectric source and the storage device.

The flexible vibratory member 101, also referred to as the fin, can vibrate in any wind, to some extent, due to the natural variation in angle of arrival of the airflow associated with wind, which is usually quite random, according to one embodiment. Therefore, the normal wind at 3-15 km/hr, for example, will demonstrate laminar flow, to a large extent, so the degree of vibration and displacement will depend on the variation in angle of arrival as well as the wind speed, according to various embodiments.

Non-laminar flow may simultaneously create a wider range of angle of arrival, as well as a higher velocity, according to various embodiments. This observation can lead to seeking passive ways to improve non-laminar flow, according to various embodiments. For example, non-laminar flow is introduced by placing an obstacle in the path of the airflow. An obstacle may consist of a cylindrical object, located a few inches away from the end of the vibratory member, as shown in FIG. 1 at obstacle 103. Obstacles are often referred to as a bluff. The bluff can produce a vortex of air in which air current paths are more variable than is the case with laminar flow, according to one embodiment.

FIG. 2 depicts a top down view of the power generator system fin, support, and piezoelectric element, and the single cylindrical bluff obstacle, according to one embodiment. For example, as depicted in FIG. 2, the wind 210 impinges on the bluff and is diverted around it, causing non-laminar flow, in a vortex, as indicated by the lines of airflow at 220. This airflow causes greater displacements of the end of the fin 101, thus inducing greater displacement in the piezoelectric device, and therefore producing more electricity at a higher voltage, and delivering more current, according to various embodiments.

Figure 4B:
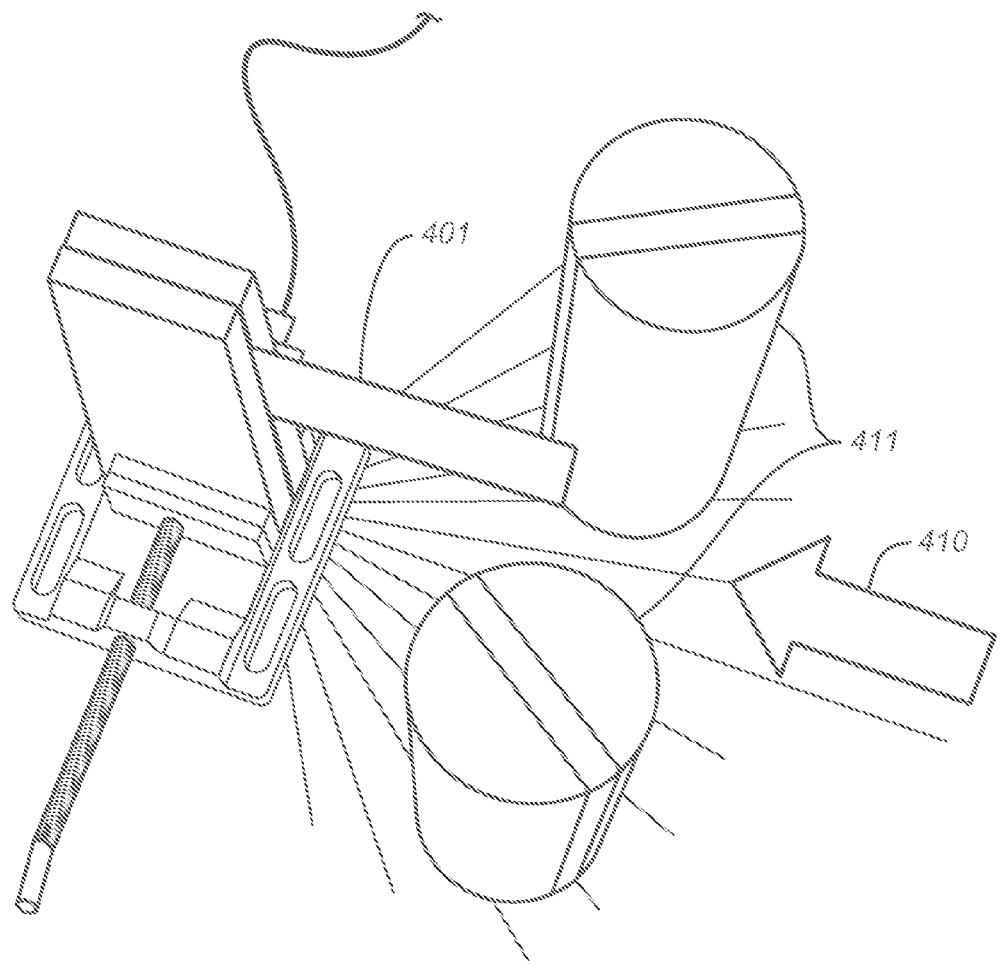

The vortex-inducing obstacle can be augmented by using two bluffs 411, in the path of wind 410, as shown in FIGS. 4A and 4B, for example, located on either side of the plane of the fin at rest, a short distance away from the plane centerline of the fin 401, according to one embodiment. Experimental results indicate that the size of the cylindrical bluff is not critical to obtaining the improvements observed. In an embodiment, alternate bluff cross sections may be employed, as shown in FIG. 5, in which eight such different cross sections are depicted: triangle 501, square 502, rounded corner square 503, diamond square 504, trapezoid 505, pentagon 506, hexagon 507, and octagon 508.

A baseline power level from an unmodified fin is found to be approximately 8 micowatts, according to one embodiment. Locating the two bluffs on radial lines from the post at a 30 degree offset, just past the end of the fin at rest, can deliver approximately 1.5 milliwatts, which is a dramatic improvement, according to various embodiments.

Figure 6A:
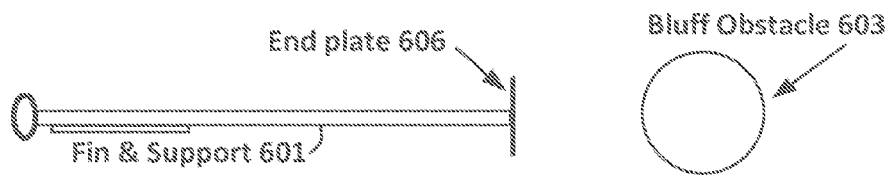
FIGS. 6A and 6B depict a device with the end of the fin are augmented with a short perpendicular plate, according to one embodiment.
Figure 6B:
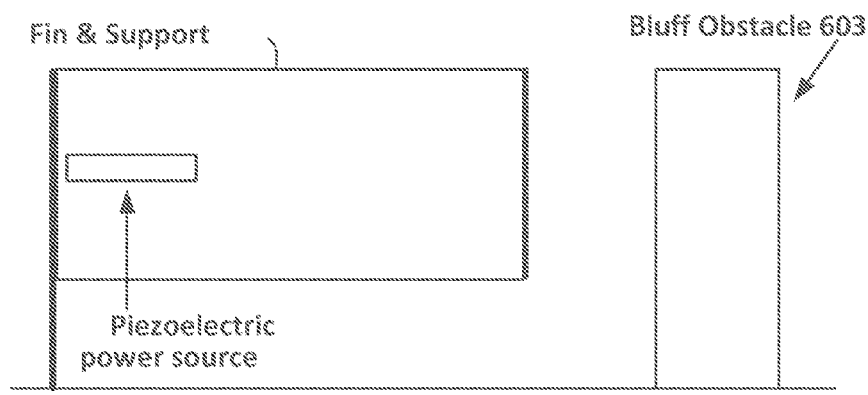

In an embodiment depicted in FIGS. 6A and 6B, an additional improvement in output power level can be obtained by adding a plate to the end of the fin at 606. As depicted in FIGS. 6A and 6B, according to various embodiments, the width of the additional plate is approximately 1 in. FIGS. 6A and 6B show a single bluff obstacle 603, but two such bluffs may also be used, as was shown in FIG. 3.

According to one embodiment, moving the two bluffs outward slightly from the centerline of the fin at rest, on a radial of 50 degrees each from the axis of the fin, can produce an even better result, with 3.9 mW, for example. This is a significant enough number to provide charging for batteries used to power remote data collection systems, according to various embodiments.

Figure 7A:
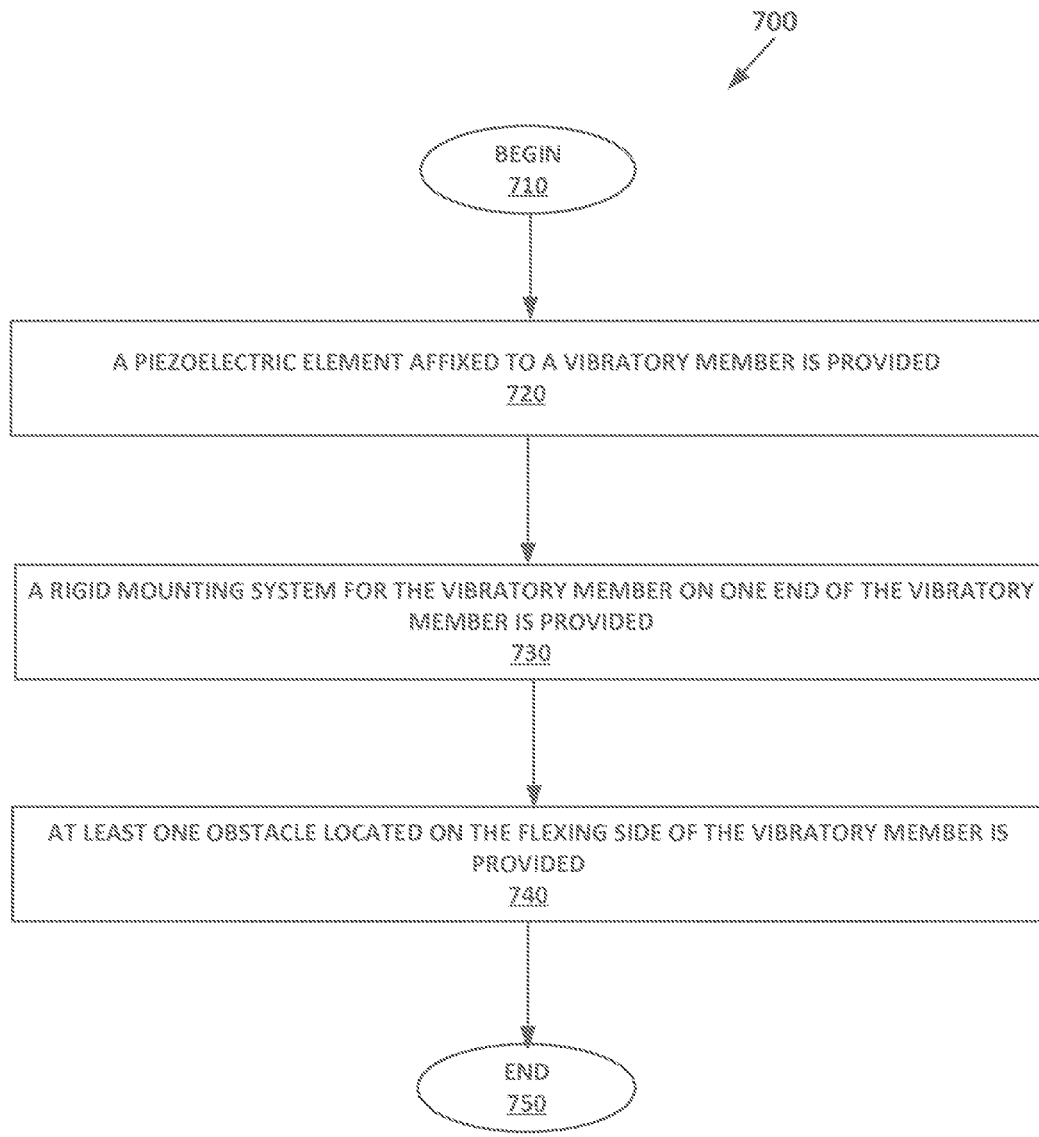
FIG. 7A depicts a flowchart of a method for improving wind-based piezoelectric power conversion, according to one embodiment.

FIG. 7A depicts a flowchart 700 of a method for improving wind-based piezoelectric power conversion, according to one embodiment.

At 710, the method begins.

At 720, a piezoelectric element affixed to a vibratory member is provided. In one embodiment, a solar power generator is also provided. Details of the solar power generator provided at 720 are described below.

The piezoelectric element can be connected to a battery for capturing electric current created by the flexing of the piezoelectric element on the vibratory member. The vibratory member may be a cantilevered brass fin. The cantilevered brass fin may further comprise a second element mounted at the displacing end, also known as the flexing end, of the vibratory member and perpendicular to the plane of the vibratory member At 730, a rigid mounting system for said vibratory member on one end of the vibratory member is provided. In one embodiment, 730 also includes coupling the rigid member to a rotatable base comprising a pivot for providing rotational movement of the rigid mounting system. Details of the rotatable base provided at 730 are described below.

At 740, at least one obstacle located on the flexing side of the vibratory member is provided, where the obstacle induces a vortex in the wind passing the obstacle and arriving at the vibratory member, which enhances wind-induced displacement in the vibratory member. For example, the obstacle may be cylindrical. The obstacle may be located parallel to the plane of the vibratory member. The obstacle may comprise two cylinders located on either side of the plane of the vibratory member. The two cylinders may be located near the unsupported end of the vibratory member.

At 750, the method ends.

Although specific operations are disclosed with respect to flowchart 700 provided according to various embodiments, such operations are exemplary. That is, embodiments of the present invention are well suited to performing various other operations or variations of the operations recited in flowchart 700. It is appreciated that the operations in flowchart 700 may be performed in an order different than presented, and that not all of the operations in flowchart 700 may be performed.

The blocks that represent features in FIGS. 1-8B can be arranged differently than as illustrated, and can implement additional or fewer features than what are described herein. Further, the features depicted in FIGS. 1-8B can be combined in various ways.

A flexure-enhancing system for augmenting the displacement of a wind-powered piezoelectric generator system is disclosed, according to various embodiments. For example, the piezoelectric generator system can comprise a piezoelectric source mounted to a thin flexible sheet and affixed to a mounting system. As the wind blows, the thin sheet is deflected causing the piezoelectric source to flex, and thus product electricity, according to one embodiment. Flexure enhancement can be achieved via the use of a vortex-inducing bluff obstacle placed in the path of wind. Two such bluff obstacles can be used to further improve performance.

The enhanced power output occurs because of an enhanced flexural system, according to one embodiment. The greater the displacement or bending of a piezoelectric device, the greater the power output, according to one embodiment.

ADDITIONAL EMBODIMENTS

In an embodiment, the basic configuration described above shows the flag and bluff obstacle assembly is oriented so that the wind 110 arrives toward the bluff obstacle 103 and passes over the distal end of the flexible fin 101 and support, as shown in FIG. 1, FIG. 2 and FIG. 3.

In order to provide more continuous power from any available wind direction, in an embodiment the system of FIG. 1 or FIG. 2 can be mounted on a swivel base 704 that orients the flexible fin & support and the bluff obstacle in the desired direction of wind arrival. Such an arrangement is shown in an embodiment in FIGS. 7B-7D.

Figure 7B:
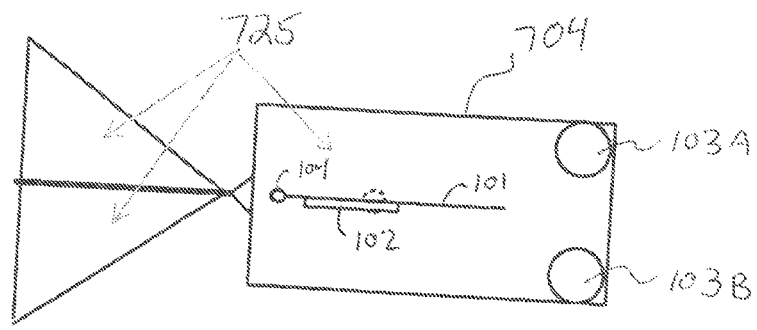
FIG. 7B shows a top view of an exemplary power generating device, according to one embodiment.
Figure 7C:
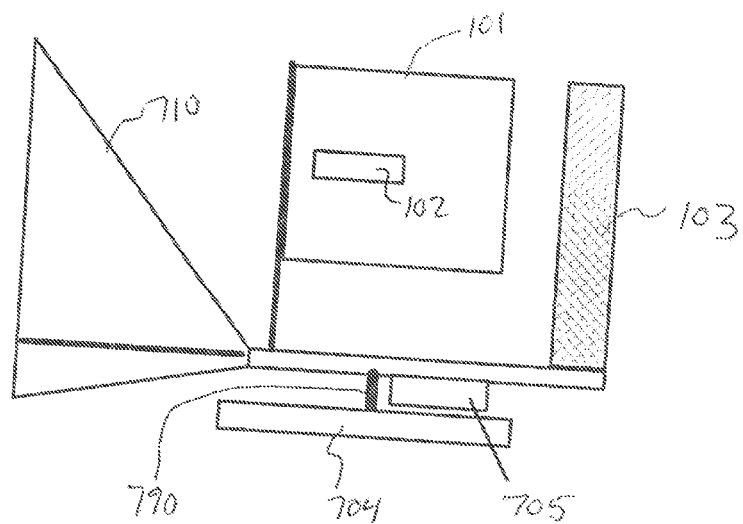
FIG. 7C shows a first side view of an exemplary power generating device, according to one embodiment.
Figure 7D:
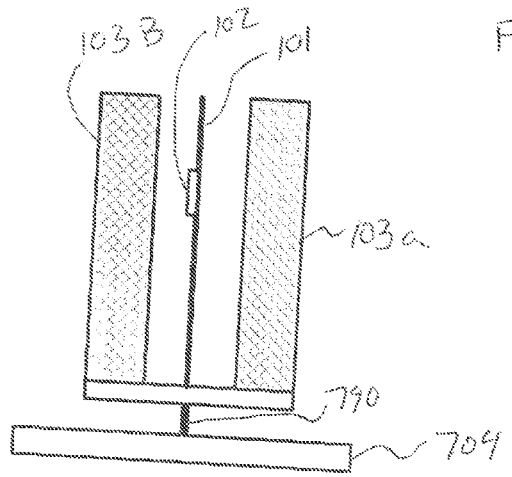
FIG. 7D shows a second side view of an exemplary power generating device, according to one embodiment.

In an embodiment, FIGS. 7B and 7D display the basic system of FIG. 3 with a dual bluff obstacle (103a and 103b) arrangement mounted on a vertical support axis 790 which allows the basic system to rotate freely through 360 degrees on pivot 790. In addition, in an embodiment, a wind vane 710 is attached to the basic system described above, also referred to as the rotating platform 704 in FIGS. 7B-7D. The wind vane 710 lies in a vertical plane, just as the flexible fin is oriented. With the wind vane 710 located opposite the side with the bluff obstacle(s) 103a and 103b, the wind will act on the wind vane to orient the assembly and the rotating platform so that the wind arrives at the bluff obstacle side first, as desired.

In an embodiment, additional sources of power from solar cells 725 may be provided, as shown in FIG. 7B. The solar cells 725 may be located on any or all horizontal surfaces such as on the upward facing portion of the rotating platform. In an embodiment, additional horizontal surfaces may be appended to the wind vane to provide additional area for mounting additional solar cells, as shown in FIG. 7B. The shape of the additional horizontal surfaces may be any suitable shape. In an embodiment, the shape may be triangular as shown in FIG. 7B, or may be rectangular, or square. The size dimension of the horizontal plane addition along the base side of the wind vane vertical element may be any desired length: less than the wind vane base, more than, or equal to it. Solar energy capture will be highest when the sun is high in the sky.

In an embodiment, solar cells 725 may be mounted to the entire periphery of the bluff obstacles. With this additional arrangement of solar cells, additional solar energy may be capture during early morning and late afternoon, when the angle of arrival of solar energy is much lower than other times when the sun is higher in the sky.

The weight distribution of the wind vane and rotating assembly may be managed to achieve neutral balance around the axis of rotation by adding filling material in the bluff obstacles as needed, or by adding suitable weights to portions of the rotating platform.

In an embodiment, the rotating platform and wind vane may be mounted to a pole so that the power generator system is elevated above ground level. This is advantageous in that wind speed decreases rapidly as such a system is located lower to the ground. Further, mounting the rotating power generator system on a pole or a roof top may reduce threat of vandalism or theft.

In an embodiment, a power management system 705 may be located beneath the base of the rotating platform. In an embodiment, the power management system may process the electricity produced by the piezoelectric generator and manage the storage of such electric energy in a battery. The battery may be used to supply energy to another device located elsewhere from the wind power generator system.

In an embodiment, the power management system may process the electrical energy from the solar cells to store this energy in the battery.

In an embodiment, the single system of FIGS. 1, 2, 6A, 6B, and 7B-7D may be expanded into an assembly of multiple flexible fin/obstacles, as shown in FIGS. 8A and 8B.

In an embodiment shown in FIG. 8A, four such flexible fin/obstacles (801, 802, 803 and 804) are arranged in a square configuration. This system as shown does not need to rotate to bring the obstacles and fin into the direction the wind is coming from. By vector decomposition, it is can be seen in FIG. 8A that the wind vector can be decomposed into two components X and Y. For any wind direction, these two components may drive any adjacent pair of flexible fin/obstacle assemblies. For example, the four wind power collectors are labeled 1, 2, 3, and 4 respectively. For the sake of discussion, these numbers may also refer to wind directions from North, East, South and West.

Winds from any of the principal directions, N, E, S, or W, will deliver wind power that may be harnessed by each wind power generators 1, 2, 3, or 4. For winds coming from directions not on the principal axes of N, E, S, or W, the wind power has a vector direction. For example, wind from the south west will impinge on wind power generators 3 and 4. Via vector decomposition, the wind components may be seen to consist of half the wind power being directed in a northerly direction, and half in a westerly direction, thus activating power generation in wind power generators 3 and 4.

Similar vector decomposition applies for winds coming from the North West, the North East, and the South East, all of which are shown in FIG. 8A.

In this embodiment with four power generators, a major advantage is that power from the wind coming from any direction can be captured, and almost all the power available from the wind in any direction of arrival can be captured.

In an embodiment, the horizontal surfaces and vertical surfaces of the individual wind power generators may be covered with solar cells, as described earlier. In an embodiment, the center square adjacent to all four of the wind power generators may also be covered with solar cells. A suitable connection from the various solar cell systems associated with each power generator may be made to deliver the electrical energy to a power conditioner for storage in a battery, as described earlier.

Another advantage of this method is that no additional physical structure is required, such as the wind vane and a rotating platform.

In an embodiment, the assembly of wind power generators may be located in any place where there is sufficient wind, such as a roof top, or pole, or the like.

In an embodiment shown in FIG. 8B, three such flexible fin/obstacles (801, 802 and 803) are arranged in a triangle configuration. Three wind vane units are arrayed at 120 degree angles from one another. Regardless of which way the wind is blowing, there will always be a component of wind direction that is parallel to at least one of the vanes' directions. The bold arrows represent arbitrary wind directions from N, E, S, W, and NE, NW, SE, and SW. The smaller arrows depict the component of wind speed in the direction of the 3 vanes that matter.

For example, the wind direction from the North is already exactly parallel to the vane direction for vane 1 (801), so the component shown is parallel to the wind direction. The wind direction from the North East [NE] has a similar component parallel to the vane 1 (801), as shown. Similarly, the wind direction from the East [E] has a component parallel to vane 2 (802). Similarly for all the other wind directions shown. The wind direction from the South [S] has two components, each of which is parallel to vane 2 (802) and vane 3 (803), and in the direction needed to excite the vane's vibratory mode.

When the wind direction is from the South [S], only vanes 2 (802) and 3 (803) will be excited. Vane 1 (801) will not experience the turbulence necessary for enhanced power production from the piezoelectric crystal on vane 1 (801).

The wind speed is reduced in the various vane directions in proportion to the cosine of the angle between the main wind vector [bold] and the desired direction for parallel action on a particular vane. So, while the apparent wind speed from the South direction along each vane direction is smaller due to the larger angle, there are two components of wind each exciting vanes 2 (802) and 3 (803), giving twice the power from a single vane with this wind direction and vane orientation.

Various embodiments have been described in various combinations. However, any two or more embodiments may be combined. Further, any embodiment may be used separately from any other embodiments.

Example embodiments of the subject matter are thus described. Although various embodiments of the subject matter have been described in a language specific to structural features and/or methodological acts, it is to be understood that the appended claims are not necessarily limited to the specific features or acts described above. Rather, the specific features and acts described above are disclosed as example forms of implementing the claims.

What is claimed is:

1. A method for improving wind-based piezoelectric power conversion, comprising:
   providing a piezoelectric element affixed to a vibratory member;
   providing a rigid mounting system for said vibratory member on one end of the vibratory member;
   coupling said rigid member to a rotatable base comprising a pivot for providing rotational movement of said rigid mounting system; and
   providing at least one obstacle located on the flexing side of the vibratory member for inducing a vortex, which enhances wind-induced displacement in the vibratory member.

2. The method of claim 1 wherein the piezoelectric element is connected to a battery for capturing electric current created by the flexing of the piezoelectric element on the vibratory member.

3. The method of claim 1 wherein the obstacle is cylindrical.

4. The method of claim 1 wherein the obstacle is located parallel to the plane of the vibratory member.

5. The method of claim 1 wherein the obstacle comprises two cylinders located on either side of the plane of the vibratory member.

6. The method of claim 5 wherein the two cylinders are located near the unsupported end of the vibratory member.

7. The method of claim 1 wherein the vibratory member comprises a cantilevered brass fin.

8. The method of claim 7 wherein the cantilevered brass fin further comprises a second element mounted at the displacing end of the vibratory member and perpendicular to the plane of the vibratory member.

9. A flexural enhancing system for improving power output of a power generator, comprising:
   a piezoelectric crystal mounted on a flexible vibratory member;
   a solar power generator;
   a rigid mounting system affixed to one end of said flexible vibratory member and comprising a mounting point for said solar power generator;
   an obstacle located adjacent to the flexing end of the vibratory member for inducing a vortex for enhancing displacement of the flexible vibratory member to produce power; and
   a rotatable base comprising a pivot for providing rotational movement of said rigid mounting system.

10. The flexural enhancing system of claim 9 wherein the obstacle comprises two cylinders whose main axes are parallel to the plane of the vibratory member and are mounted on either side of the plane of the vibratory member, near the flexing end of the vibratory member.

11. The flexural enhancing system of claim 9 wherein the obstacle cross section is selected from the group consisting of: a triangle, a square, a pentagon, a hexagon, an octagon, and a polygon.

12. The flexural enhancing system of claim 9 wherein the flexible vibratory member is augmented with a flat plate mounted at the unsupported end and is perpendicular to the plane of the vibratory member.

13. A method for improving wind-based piezoelectric power conversion, comprising:
   providing a piezoelectric element affixed to a vibratory member;
   providing a solar power generating unit;
   providing a rigid mounting system for said solar power generating unit and said vibratory member on one end of the vibratory member;
   coupling said rigid member to a rotatable base comprising a pivot for providing rotational movement of said rigid mounting system;
   providing at least one obstacle located on the flexing side of the vibratory member, wherein the obstacle induces a vortex for improved displacement in the vibratory member.

14. The method of claim 13 wherein the piezoelectric element is connected to a battery for capturing electric current created by the flexing of the piezoelectric element on the vibratory member and for capturing current created by the solar power generating unit, said battery disposed below said rotatable base.

15. The method of claim 13 wherein the at least one obstacle comprises two obstacles that are equally spaced with respect to the vibratory member.

16. The method of claim 15 wherein the two obstacles are located parallel to the plane of the vibratory member.

17. The method of claim 13 wherein the obstacle comprises two cylinders located on either side of the plane of the vibratory member.

18. The method of claim 17 wherein the two cylinders are located near the unsupported end of the vibratory member.

19. The method of claim 13 wherein the vibratory member comprises a cantilevered brass fin.

20. The method of claim 19 wherein the cantilevered brass fin further comprises a second element mounted at the displacing end of the vibratory member and perpendicular to the plane of the vibratory member.

21. A power generator, comprising:
- a plurality of rigid mounting systems coupled with a rotatable base, each of said rigid mounting systems having attached thereto a flexible vibratory member and comprising a mounting point for a solar power generator;
- a piezoelectric crystal mounted on each of the flexible vibratory members;
- a solar power generator coupled with each mounting point of the rigid members;
- a plurality of obstacles, each located adjacent to the flexing end of each of the vibratory members for inducing a vortex in the wind passing the obstacle and inducing a vortex in the wind, thereby enhancing the displacement of the flexible vibratory member, which causes the piezoelectric power generator to produce more power.

22. The power generator of claim 21 wherein the plurality of obstacles comprises two cylinders whose main axes are parallel to a plane of one vibratory member and are mounted on either side of the plane of the vibratory member, near the flexing end of the vibratory member.

23. The power generator of claim 21 wherein the cross section of one of the obstacles is selected from the group consisting of: a triangle, a square, a pentagon, a hexagon, an octagon, and a polygon.

24. The power generator of claim 21 wherein one of the flexible vibratory members is augmented with a flat plate mounted at the unsupported end and is perpendicular to the plane of the one vibratory member.

25. The power generator of claim 21 wherein said plurality of rigid mounting systems comprises at least 3 flexible vibratory members.

26. The power generator of claim 21 wherein said plurality of rigid mounting systems comprises at least 4 flexible vibratory members.

* * * * *